United States Patent
Trogisch et al.

(10) Patent No.: US 6,573,447 B2
(45) Date of Patent: Jun. 3, 2003

(54) ELECTRIC DEVICE HAVING A HOUSING MADE OF SOLIDIFIED POLYMERIC MATERIAL

(75) Inventors: Günter Trogisch, Seeheim-Jugenheim (DE); Peter Schäfer, Darmstadt-Eberstadt (DE); Stefan Plötz, Iserlohn (DE); Martin Quarder, Minden (DE)

(73) Assignee: Firma Carl Freudenberg, Weinheim (DE)

( * ) Notice: Subject to any disclaimer, the term of this patent is extended or adjusted under 35 U.S.C. 154(b) by 27 days.

(21) Appl. No.: 09/900,638

(22) Filed: Jul. 6, 2001

(65) Prior Publication Data

US 2002/0031940 A1 Mar. 14, 2002

(30) Foreign Application Priority Data

Jul. 6, 2000 (DE) .......................... 100 32 849

(51) Int. Cl.$^7$ ................................. H05K 5/00
(52) U.S. Cl. ................. 174/52.1; 174/50.52; 174/65 R; 361/827
(58) Field of Search .............. 174/52.1, 50.52, 174/59, 65 R, 68.3, 70 R, 70 C; 361/725, 827; 439/264

(56) References Cited

U.S. PATENT DOCUMENTS

| | | | | |
|---|---|---|---|---|
| 3,839,596 A | * | 10/1974 | Glover | 174/152 R |
| 5,464,428 A | * | 11/1995 | Hill | 607/1 |
| 5,840,402 A | * | 11/1998 | Roberts et al. | 428/131 |
| 6,110,576 A | * | 8/2000 | Decker et al. | 428/300.1 |
| 6,146,577 A | * | 11/2000 | Yamaki et al. | 264/500 |
| 6,233,155 B1 | * | 5/2001 | Moster et al. | 361/752 |

FOREIGN PATENT DOCUMENTS

| | | |
|---|---|---|
| DE | 94 20 980.4 | 4/1995 |
| DE | 196 06 187 | 8/1997 |
| DE | 197 33 237 | 5/1999 |
| DE | 198 12 880 | 9/1999 |
| DE | 198 04 607 | 10/1999 |
| DE | 198 17 198 | 10/1999 |
| DE | 299 10 305 | 12/2000 |
| EP | 0 485 838 | 5/1992 |
| JP | 2000-31606 | 1/2000 |

* cited by examiner

Primary Examiner—Dean A. Reichard
Assistant Examiner—W. David Walkenhorst
(74) Attorney, Agent, or Firm—Kenyon & Kenyon

(57) ABSTRACT

An electric device including a housing having a wall (2) made of solidified polymeric material and at least one electric component (5) which is situated inside the housing and is connected via at least one electric line (4) to at least one electric component which is situated outside or inside the housing, the line (4) being configured to be flexible and being at least partially embedded in the wall (2) of the housing during the molding and solidification of the housing.

14 Claims, 4 Drawing Sheets

US 6,573,447 B2

ELECTRIC DEVICE HAVING A HOUSING MADE OF SOLIDIFIED POLYMERIC MATERIAL

BACKGROUND OF THE INVENTION

1. Field of the Invention

The present invention relates to an electric device having a housing made of solidified polymeric material in which electric components situated inside or outside the housing are connected via electric lines, as well as to a method for manufacturing it.

2. Description of Related Art

In various application areas of electric devices, the housing is a molded plastic part which serves to protect or support electric functional units. Electric devices, in particular those used in motor vehicles, must be able to resists difficult ambient conditions such as dirt and dust burden, high temperature variations, humidity, in particular condensing humidity and, as a consequence thereof, corrosion. To increase the reliability of electronic circuits such as printed circuit boards, it is known to encapsulate the electronic components with plastic. It is also known to protect flexible conductor traces against mechanical damage or against oxidation by back-injecting them with a thermoplastic material.

A printed circuit board in which a flexible carrier is backed-injected with a thermoplastic material is described in European Patent EP 0 485 838. A molded plastic part having a protected conductor trace is known from German Patent DE OS 198 12 880. The conductor trace is embedded between a plastic film and a covering foil. The molded plastic part can be used for shielding electric devices.

SUMMARY OF THE INVENTION

It is an object of the invention to provide an electric device having a plastic housing in such a manner that electric components inside or outside the housing can be connected in a technically simple manner and that the production cost can be reduced.

These and other objects of the invention are achieved by an electric device comprising a housing having a wall (2) made of solidified polymeric material and at least one electric component (5) which is situated inside the housing and is connected via at least one electric line (4) to at least one electric component which is situated outside or inside the housing, wherein the line (4) is configured to be flexible and is at least partially embedded in the wall (2) of the housing during the molding and solidification of the housing.

BRIEF DESCRIPTION OF THE DRAWINGS

The present invention will be described in greater detail with reference to the following drawings wherein.

DETAILED DESCRIPTION OF THE INVENTION

Figure 1:
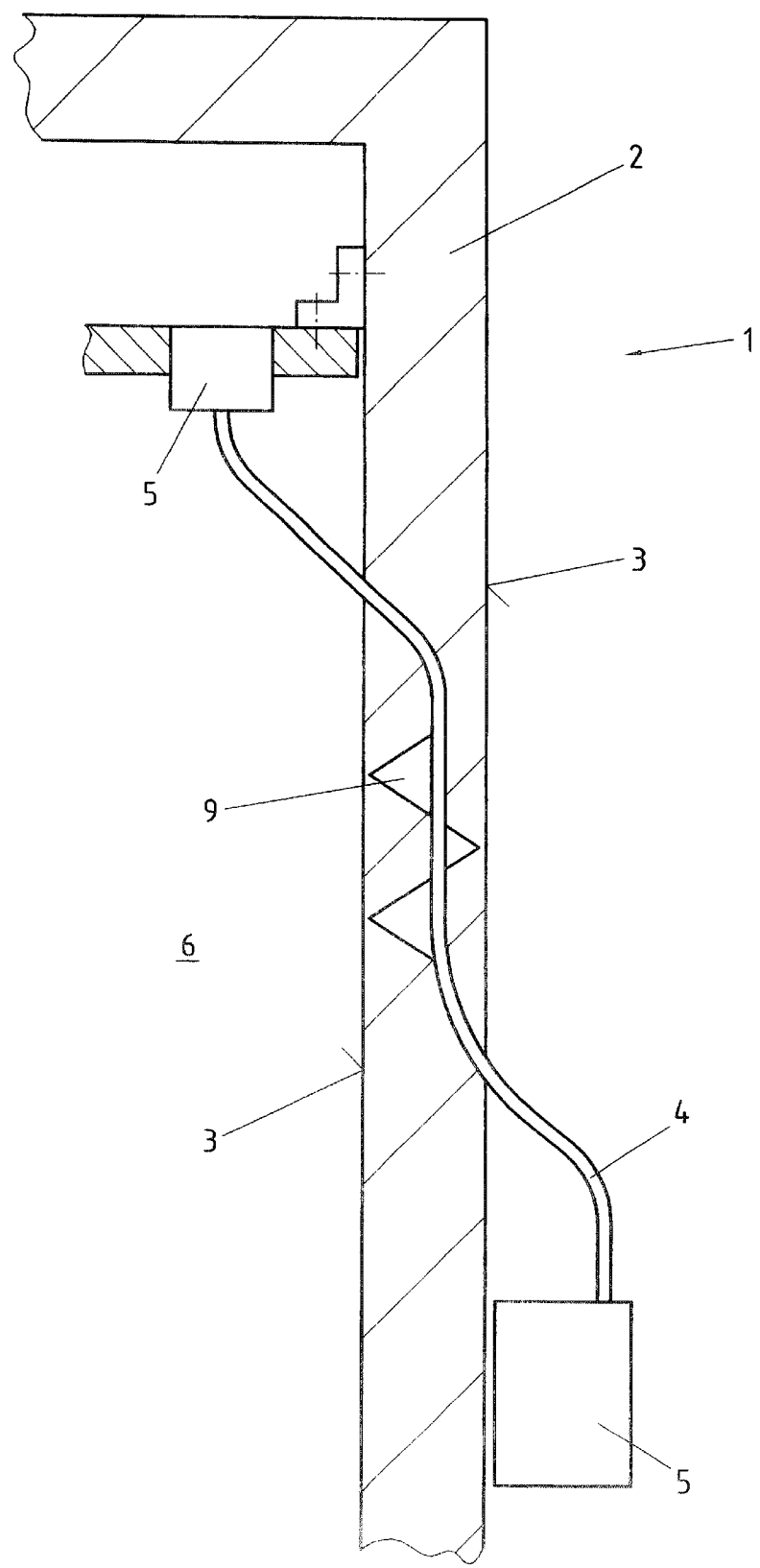
FIG. 1 shows a simplified schematic representation of a subregion of an electric device in a sectional view.

In FIG. 1, it is schematically shown in simplified manner how an electric line 4 connects components 5 outside and inside an electric device 1. Along one section, electric line 4 is run in wall 2 of the housing. The distance from surface 3, both toward the interior space 6 and toward the surface of the external space, is predetermined by spacers 9.

Figure 2:
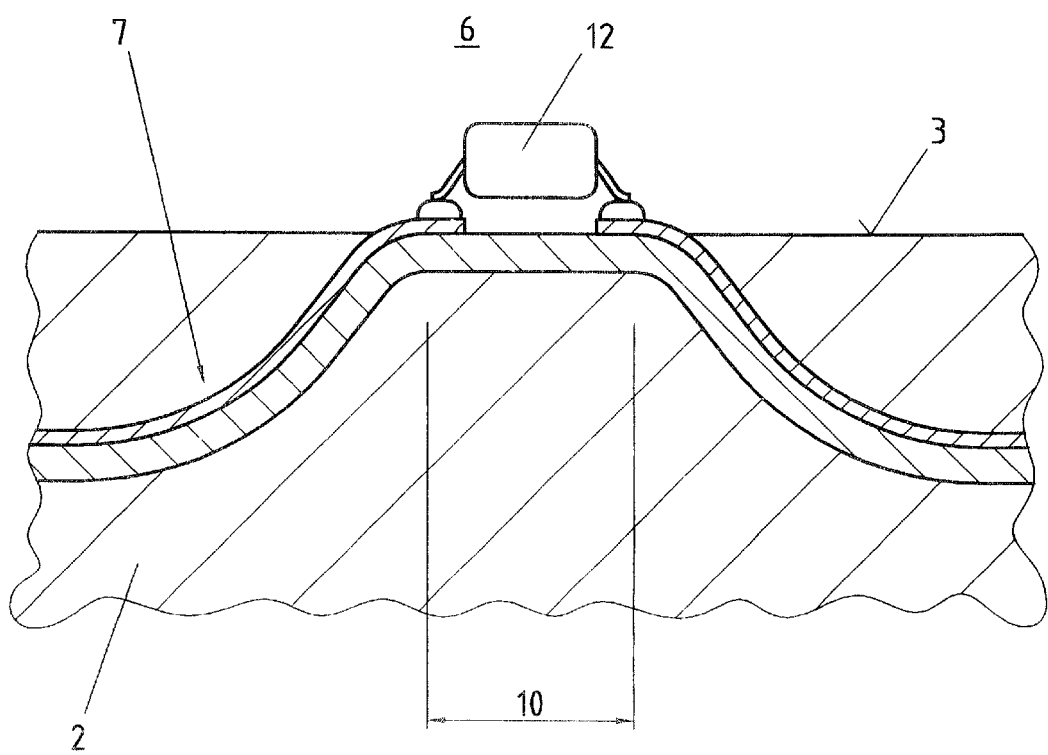
FIG. 2 shows an enlarged schematic representation of a cut-away portion of the housing wall featuring a flexible conductor trace and an electronic component in a sectional view.

FIG. 2 shows a cut-away portion of a housing wall 2 including an electric line 7 which is embedded in the wall flush with the surface in a subregion 10. In this subregion 10 of surface 3, an electronic component 12 which is connected to the conductor trace by soldering is shown in interior space 6.

Figure 3:
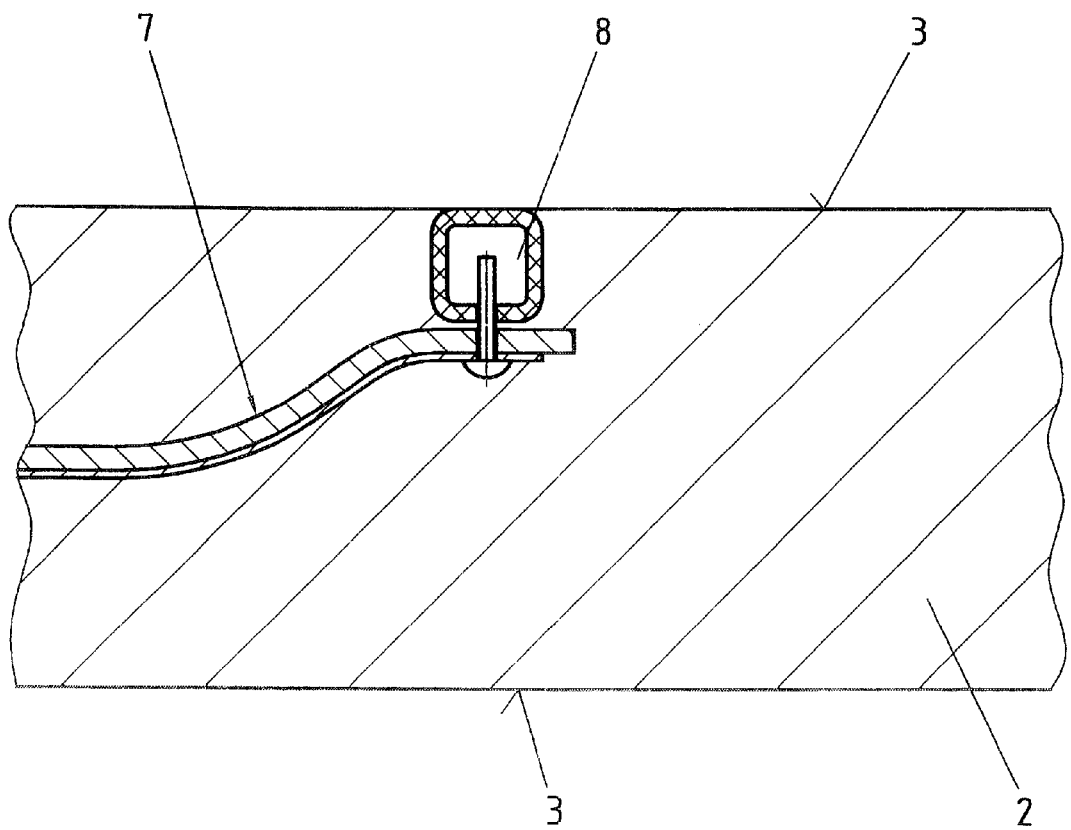
FIG. 3 shows a section through a housing wall featuring a flexible conductor trace and a contact element.

FIG. 3 shows a sectional drawing through a housing wall 2 featuring a flexible conductor trace 7 which runs approximately in the middle of the housing wall and at whose end a contact element 8 is situated. Contact element 8 ends flush with surface 3.

Figure 4:
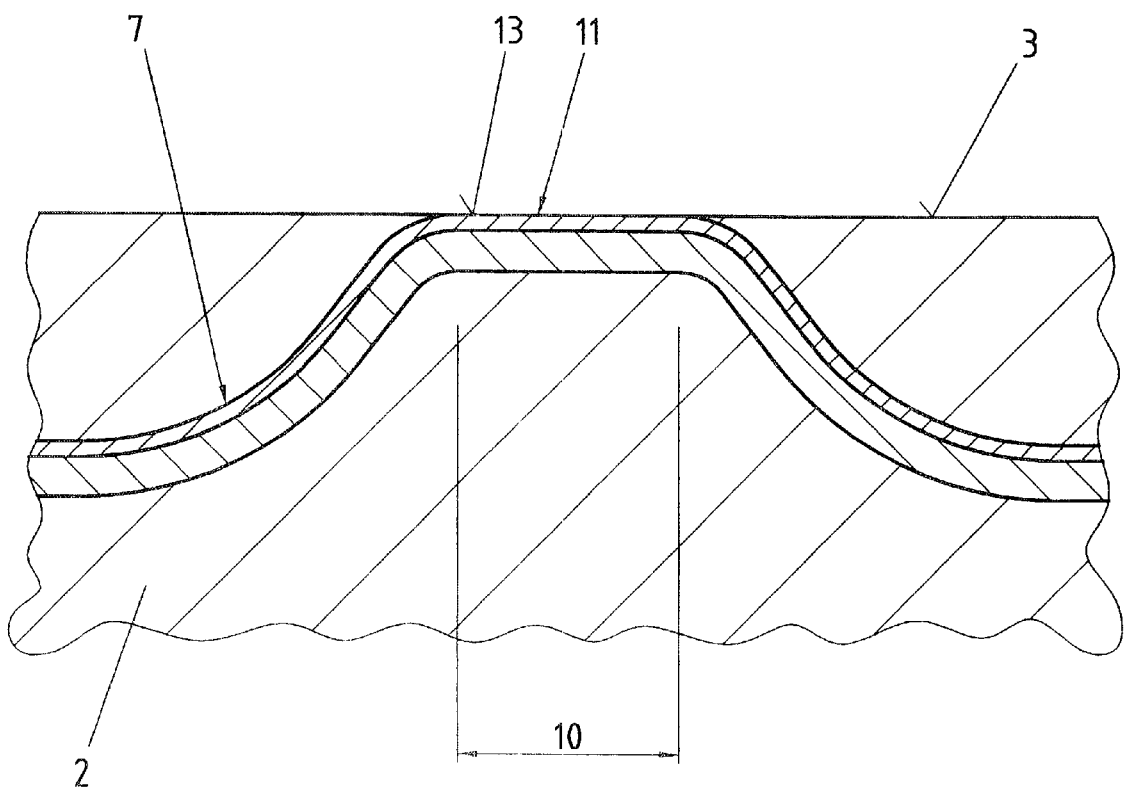
FIG. 4 shows a cut-away portion of the housing wall featuring a flexible conductor trace and a contact area in a schematic representation.

FIG. 4 shows a flexible conductor trace 7 which, in a subregion 10, has a contact area 11 which ends flush with surface 3 of housing wall 2. Thus, a movable electrical connection to a component which is not shown can be established along subregion 10 via a sliding-action contact 13.

The provision is made for the line to be flexible and to be at least partially embedded in the wall of the housing during the molding and solidification of the housing. Thus, the invention starts out from the assumption that the manufacture of an electric device is simplified by using the wall of the housing as a protective device for the electric line and by embedding the lines in the plastic housing already during the manufacture thereof. Lines running in the wall of the housing are better protected against mechanical damage and humidity than exposed lines. This increases the reliability of the device. This is particularly advantageous in the case of devices used in automotive engineering. The housing of these devices is mostly composed of housing parts having a complex three-dimensional structure. The present invention makes it possible to establish the connection between electric components in a reliable manner and, at the same time, at a low cost even in these housing structures. The electric components can be electric switches or connectors situated outside or inside the housing. Connectors can be embedded in the prefabricated condition. In this manner, the assembly time is shortened. Space is saved because the conductors are arranged within the wall. Since printed circuit boards for arranging the conductors are omitted, the weight of the device is reduced as well. Electronic components which are capable of resisting the temperature of the plastic melt can also be accommodated in the housing wall together with the interconnection technology.

It is advantageous for the conductor trace to be embedded in one working step during the injection molding of the housing. Thus, the enclosure of the conductors is injection-molded in one piece in an inexpensive manner, allowing the electric device to be manufactured in a particular inexpensive manner. The flexible conductor trace is inserted into the cavity of the injection mold, the mold is closed, and the enclosure is made with the plastic melt in one piece. Subsequent to hardening, the flexible conductor trace is virtually "dug in" by polymeric material via the solidification of the plastic melt. The flexible line has turned into a line that is solidified in the plastic of the housing.

It is an advantageous for the flexible conductor trace to include at least two conductors lying side-by-side. In this manner, the line lying within the plastic of the housing wall can connect several functional units or electric components. It is possible to manufacture simple housing components in an inexpensive manner which contain go-and-return conductors to end switches or actuators.

It is beneficial for the flexible conductor trace to be provided with spacers defining a distance from a surface of the wall. In this manner, a defined position of the conductor trace in the housing is achieved. It is avoided that the electric line gets to the unprotected surface of the housing during injection molding. In this context, it is advantageous for the flexible conductor trace to be provided with bends. These bends can be made at a low cost during the manufacture of the flexible conductor trace by punching the film carrier.

It is preferred for the conductor trace to carry at least one contact element which is embedded in the wall. In this manner, it is possible for prefabricated lines whose ends are provided with connectors to be processed as so-called "inserts". Thus, the connectors and the electrical line form part of the housing of the electric device.

In the case of electric devices having a movable housing part, it is frequently required for this movable housing part to be electrically connected to the fixed housing part. It is therefore advantageous that the flexible conductor trace has at least one subregion which is embedded in the wall flush with the surface and if provision be made for at least one exposed contact area. Via sliding-action contacts, it is thus possible to establish an electrical connection between a movable and a stationary housing part.

It is expedient for the flexible conductor trace to be embedded in the wall flush with the surface in at least two different subregions. In this manner, it is possible for several electric components to be electrically connected at the surface of the housing.

It is also preferred for the electric line to be continuously embedded in the wall at a distance from the surface, and to run essentially in the middle of the wall. The electric line is thus protected best against mechanical influences and against humidity.

To reinforce the wall of complex three-dimensional plastic housing parts, it can be advantageous for the electric line to form a reinforcement in the wall of the housing. This can be easily achieved by configuring the film carrier and/or the conductor pattern such that they are correspondingly thick and have a suitable shape. In this manner, the dimensional stability of the plastic housing can be enhanced in a simple manner. It is preferred for the wall of the electric device to be composed of thermoplastic material. Thermoplastic materials can be processed particularly well by injection molding. Particularly suitable is a plastic material of the series of polyamide, polyester, polyurethanes, polyacetals, polystyrenes, polyimides, polyphenylene oxide, polycarbonate, polyphenyl sulphide, polypropylene and copolymers thereof or mixtures of the named polymers.

Preferred is a plastic which is processed by injection molding and whose softening temperature is higher than a softening temperature of the flexible conductor trace. In this manner, it is achieved that the adhesion of the intermediate layer which joins the conductor pattern to the film carrier is not impaired.

To manufacture an electric device in which at least one electric line is embedded in a plastic housing made of solidified polymeric material, preference is given to a method including the following steps:

a) inserting at least one electric line into a cavity of an injection mold,
b) injecting at least one plastic melt into the cavity,
c) hardening of the plastic part produced in this manner by injection molding,
d) removing the plastic part from the mold.

This method makes it possible to manufacture an electric device having a complex three-dimensional housing structure in which the housing wall at the same time provides a reliable protection of electric connecting lines. A flexible conductor trace can be integrated in a housing section in one working step by the injection molding of a polymeric material. In this context, it is advantageous for the flexible conductor trace to be provided with spacers. Using these spacers, it is possible to observe a defined distance from the cavity surface during injection molding. In this manner, the route of the flexible conductor trace in the housing can be selected to run in the middle of the wall so that the conductor trace is excellently protected against mechanical influences and against humidity.

What is claimed is:

1. An electric device comprising a housing having a wall (2) made of solidified polymeric material and at least one electric component (5) which is situated inside the housing and is connected via at least one electric line (4) to at least one electric component which is situated outside or inside the housing, wherein the line (4) is configured to be flexible having a portion thereof embedded in the wall (2) and a portion thereof exposed from the wall of the housing.

2. The device as recited in claim 1, wherein one component of the electric line is a flexible conductor trace (7); and the embedding of a longitudinal section of the flexible conductor trace is formed in one working step by the injection-molding of the polymeric material.

3. The device as recited in claim 2, wherein the flexible conductor trace (7) includes at least two conductors lying side-by-side.

4. The device as recited in claim 2, wherein the flexible conductor trace (7) is provided with spacers defining a distance from a surface (3) of the wall.

5. The device as recited in claim 4, wherein the flexible conductor trace (7) is provided with bends (9).

6. The device as recited in claim 2, wherein the flexible conductor trace (7) bears at least one contact element (8) which is embedded in the wall (2).

7. The device as recited in claim 2, wherein the flexible conductor trace (7) is embedded flush with the surface at least in two different subregions of the wall (2).

8. The device as recited in claim 2, wherein the flexible conductor trace is continuously embedded in the wall at a distance from the surface and runs substantially in the middle of the wall.

9. The device as recited in claim 1, wherein the line (4) forms a reinforcement in the wall (2) of the housing.

10. The device as recited in claim 1, wherein the wall (2) is composed of thermoplastic material.

11. The device as recited in claim 10, wherein the softening temperature of the flexible conductor trace is higher than the softening temperature of the thermoplastic material.

12. A method for manufacturing an electric device including at least one electric line in a plastic housing made of solidified polymeric material, the method comprising:

a) inserting the at least one electric line into a cavity of an injection mold, b) injecting at least one plastic melt into the cavity to expose the electric line at one end to provide for a first connection point and exposing the electric line at a second portion flush with one surface of the wall, c) hardening of the plastic part produced in this manner by injection molding d) removing the plastic part from the mold.,

13. The method as recited in claim 12, wherein the electric line is designed as a flexible conductor trace and having a distance from the cavity surface is predetermined by spacers.

14. An electric device comprising:

a housing having a wall, a first component situated inside or outside the housing;

a second component situated inside or outside the housing; and a flexible conductor line configured to have a portion thereof embedded in the wall and a portion thereof flushed with one surface of the wall and at least partially exposed from the surface of the wall;

wherein the conductor line contacts the first component at one end and the conductor line contracts the second component at the portions that are partially exposed from the wall.

* * * * *